US010008245B1

(12) United States Patent
Hoch

(10) Patent No.: US 10,008,245 B1
(45) Date of Patent: Jun. 26, 2018

(54) POSITIONING COMPONENTS IN A RACK TO PERMIT BASE PLANE ACCESS

(71) Applicant: Microsoft Technology Licensing, LLC, Redmond, WA (US)

(72) Inventor: Bruce Hoch, Colorado Springs, CO (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days. days.

(21) Appl. No.: 15/640,388

(22) Filed: Jun. 30, 2017

(51) Int. Cl.
| | |
|---|---|
| *H05K 7/00* | (2006.01) |
| *G11B 33/04* | (2006.01) |
| *G06F 1/20* | (2006.01) |
| *H05K 7/20* | (2006.01) |
| *G11B 33/12* | (2006.01) |

(52) U.S. Cl.
CPC ............ *G11B 33/0461* (2013.01); *G06F 1/20* (2013.01); *G11B 33/126* (2013.01); *H05K 7/20136* (2013.01)

(58) Field of Classification Search
CPC ........................................................ G06F 1/18
USPC ..................................................... 361/679.01
See application file for complete search history.

(56) References Cited

U.S. PATENT DOCUMENTS

| | | | |
|---|---|---|---|
| 9,437,250 B2 | 9/2016 | Mundt et al. | |
| 2002/0134531 A1* | 9/2002 | Yanagida | .................. G06F 1/18 165/80.3 |
| 2002/0148753 A1 | 10/2002 | Egami | |
| 2003/0206398 A1 | 11/2003 | Stamos et al. | |
| 2004/0257763 A1 | 12/2004 | Andresen et al. | |
| 2005/0057898 A1 | 3/2005 | El-batal et al. | |
| 2005/0219833 A1 | 10/2005 | Wu et al. | |
| 2005/0257232 A1* | 11/2005 | Hidaka | ................ G11B 33/126 720/654 |
| 2008/0298009 A1 | 12/2008 | Weng et al. | |
| 2013/0229767 A1 | 9/2013 | Ganta papa rao bala | |
| 2013/0335913 A1 | 12/2013 | Brashers et al. | |
| 2015/0116861 A1 | 4/2015 | Sorenson, III et al. | |
| 2016/0259382 A1 | 9/2016 | Goodman et al. | |
| 2016/0309610 A1 | 10/2016 | Ross et al. | |

FOREIGN PATENT DOCUMENTS

| | | |
|---|---|---|
| CN | 201084413 Y | 7/2008 |
| CN | 203456093 U | 2/2014 |

OTHER PUBLICATIONS

"SR2300 2U Server Chassis", http://www.intel.com/content/dam/support/us/en/documents/motherboards/server/chassis/sr2300/tps.pdf, Jun. 2003, 78 pages.

* cited by examiner

*Primary Examiner* — Jerry Wu
(74) *Attorney, Agent, or Firm* — Buckley, Maschoff & Talwalkar, LLC

(57) ABSTRACT

Aspects extend to devices that facilitate positioning components in a rack to permit base plane access. In one aspect, a drive carrier rail is configured to have variable widths to facilitate positioning a drive carrier in a fixed position within a slot (of a rack) where a drive is disengaged from the base plane printed circuit board (PCB). In another aspect, at least one slot rail of a slot includes a (e.g., sheet metal) spring. The spring allows a drive carrier to rest on the spring in a fixed position where the hard drive is disengaged from the base plane printed circuit board.

7 Claims, 12 Drawing Sheets

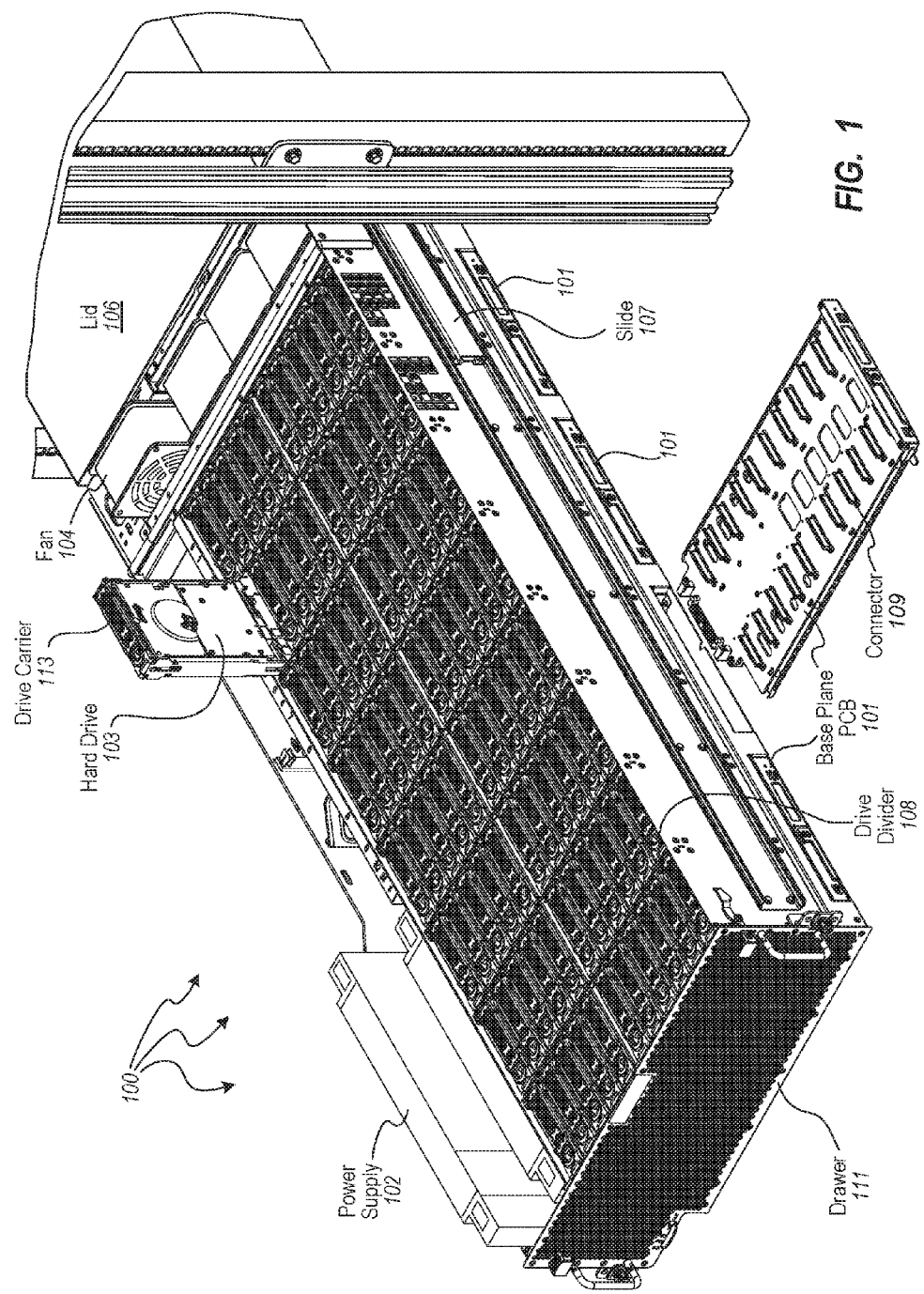

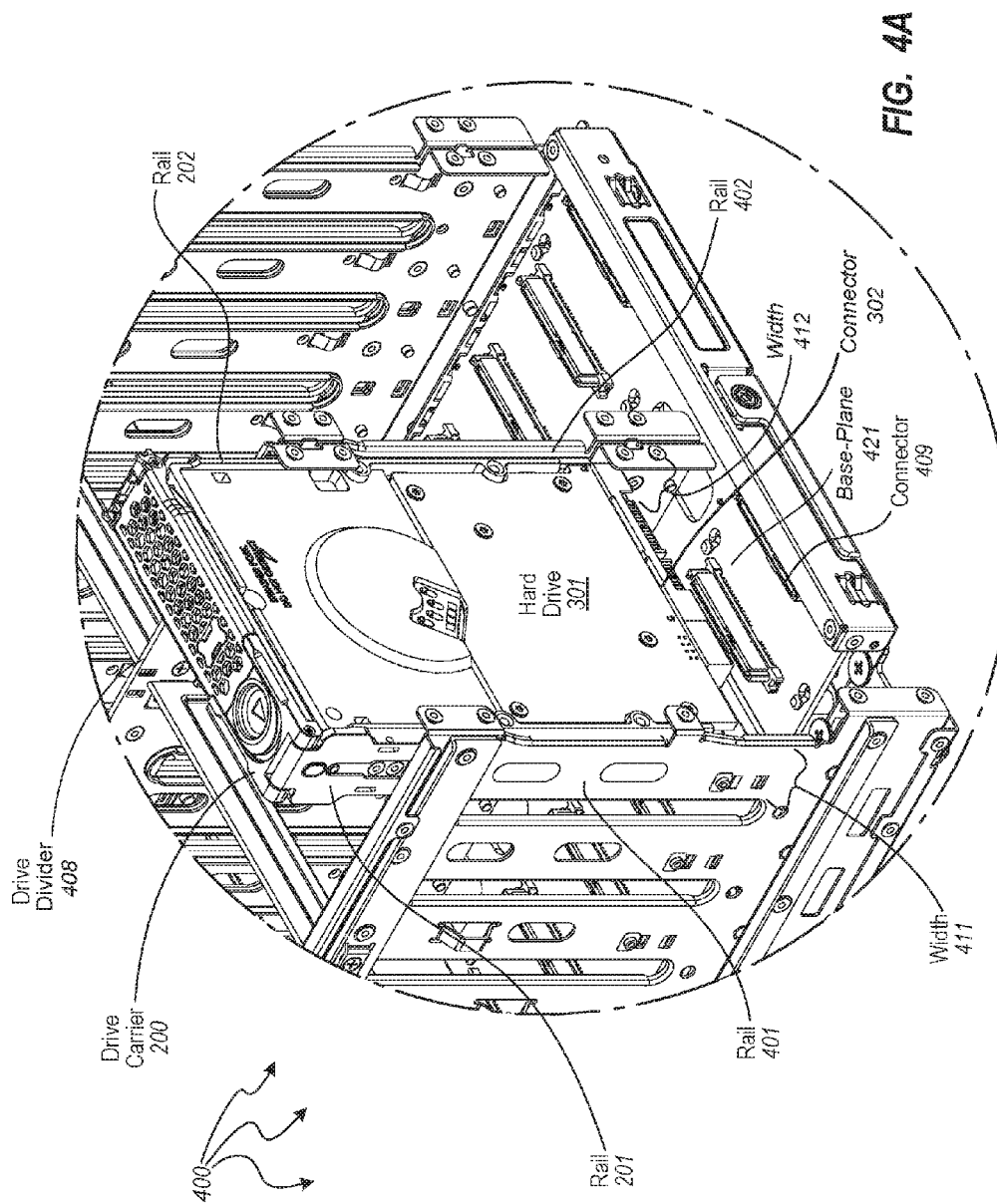

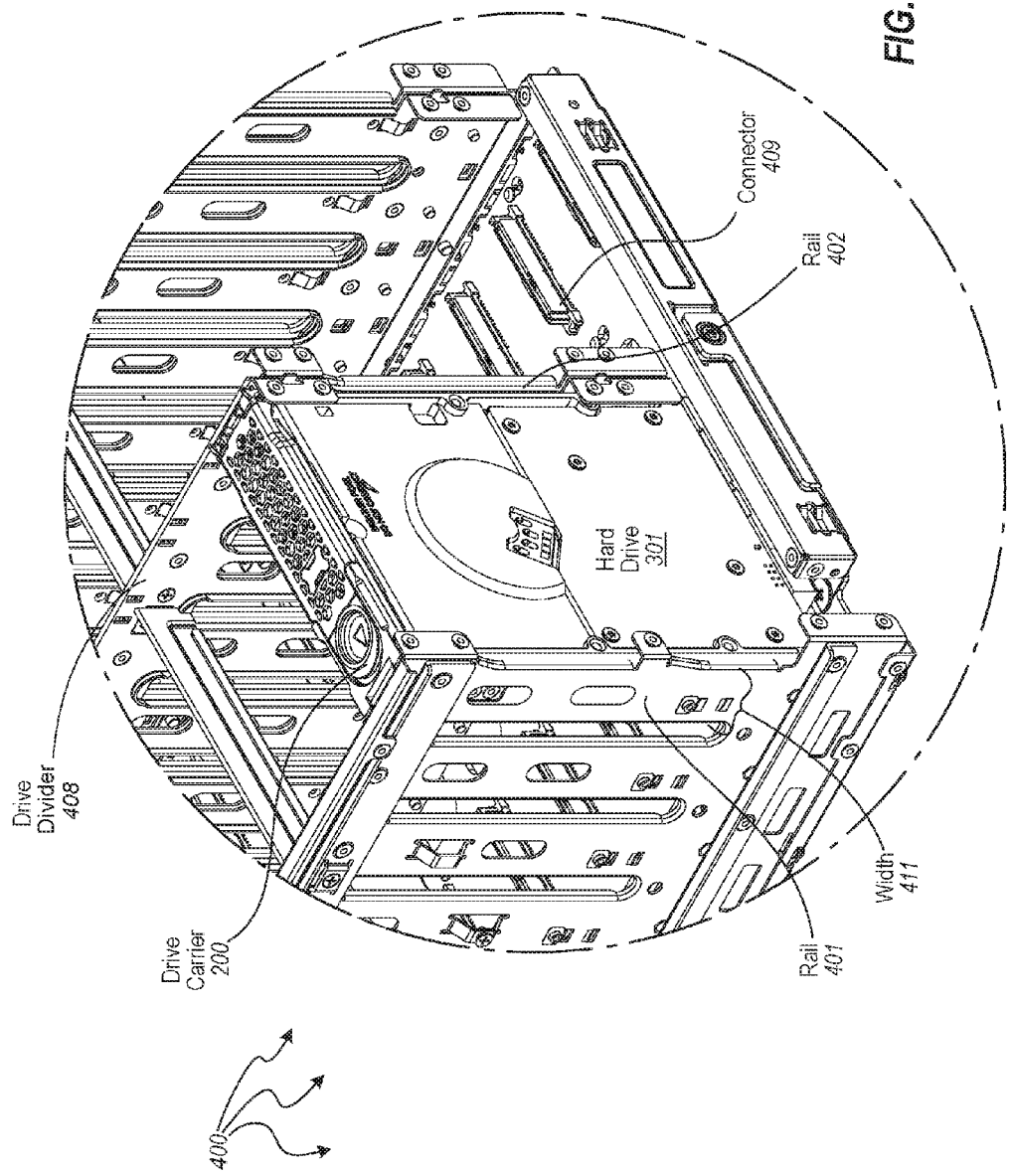

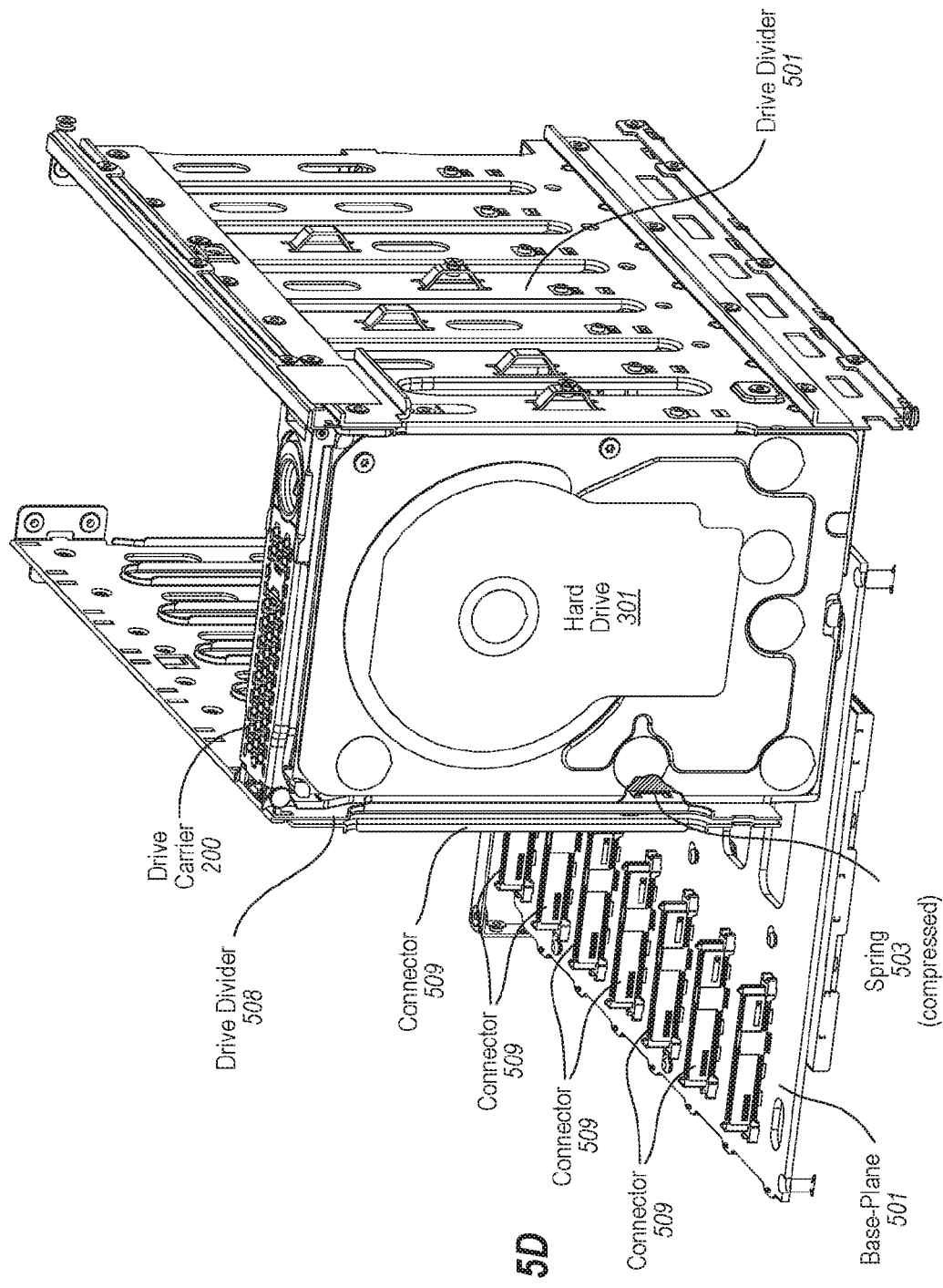

POSITIONING COMPONENTS IN A RACK TO PERMIT BASE PLANE ACCESS

CROSS-REFERENCE TO RELATED APPLICATIONS

Not Applicable.

BACKGROUND

Background and Relevant Art

Computer systems and related technology affect many aspects of society. Indeed, the computer system's ability to process information has transformed the way we live and work. More recently, computer systems have been coupled to one another and to other electronic devices to form both wired and wireless computer networks over which the computer systems and other electronic devices can transfer electronic data. Accordingly, the performance of many computing tasks is distributed across a number of different computer systems and/or a number of different computing environments. For example, distributed applications can have components at a number of different computer systems.

In many computing environments, multiple components are grouped together in an equipment rack. One or more equipment racks can be grouped in a common physical location in what is often referred to as a "data center". Components in an equipment rack can include servers (e.g., "blades"), hard drives, networking equipment (e.g., top-of-rack (TOR) switches), power supplies, etc.

From time to time, components in an equipment rack may require servicing. Depending on the configuration of the equipment rack and the components, the components may need to be fully removed from the equipment rack for servicing. It may also be that some components need to be removed from a rack in order to gain access to other components in the rack. For example, to service a hard drive base-plane Printed Circuit Board (PCB), a technician may be forced to fully remove hard drives connected to the hard drive base-plane Printed Circuit Board (PCB) from a drive enclosure.

A drive enclosure can include a large number of hard drives. Each hard drive can be inserted into a slot of a hard drive base-plane Printed Circuit Board (PCB). Thus, to free up the hard drive base-plane Printed Circuit Board (PCB) for removal, every hard drive must be physical disconnected from the hard drive base-plane Printed Circuit Board (PCB) and physically removed from the drive enclosure. When replacing hard drives into the drive enclosure, it is appropriate that hard drives are inserted back into the same slot from which they were removed.

Failure to replace a hard drive into the same slot can cause issues with drive mapping possibly leading to data loss. The potential for human error during hard drive replacement can cause a hard drive to be placed in the wrong slot. As the number of hard drives increases so does the potential for human error during hard drive replacement.

BRIEF SUMMARY

Examples extend to devices facilitating positioning components in a rack to permit base plane access. In general, a drive carrier containing a hard drive can be inserted into a slot in a rack to engage the hard drive (mechanically and electrically) with a base plane printed circuit board (PCB). Components of a drive carrier rail and/or a slot rail can be configured to hold the drive carrier in a position within a slot where the drive is disengaged from the base plane printed circuit board (PCB). Disengagement of the hard drive from the base plane printed circuit board (PCB) allows the base plane printed circuit board (PCB) to be accessed for servicing, replacement, etc. while the drive carrier remains in the slot.

In one aspect, a drive carrier rail is configured to facilitate positioning a drive carrier in a fixed position within a slot (of a rack) where the drive is disengaged from the base plane printed circuit board (PCB). Slot rails in the slot can be different widths, one narrower and the other wider. The drive carrier can include a narrower driver carrier rail and a variable width driver carrier rail. The narrower drive carrier rail can be at least slightly narrower than the narrower slot rail. The variable width drive carrier rail can include a narrower portion and a wider portion. The narrower portion is at least slightly narrower than the narrower slot rail. The wider portion is at least slightly narrower than the wider slot rail and at least slightly wider than the narrower slot rail.

To engage the drive with the base plane printed circuit board (PCB), the drive carrier is oriented so that the narrower drive carrier rail is inserted into the narrower slot rail and the variable width drive carrier rail is inserted into the wider slot rail. To permit access to the base plane printed circuit board (PCB), the drive carrier is removed from the slot, rotated 180 degrees, and reinserted into the slot. Upon reinsertion, the narrower drive carrier rail is inserted into the wider slot rail and the variable width drive carrier rail is inserted into the narrower slot rail. The drive carrier can be inserted into the slot until the wider portion of the variable width drive carrier rail prevents further movement of the drive carrier due to the width of the wider portion being greater than the width of narrower slot rail. As such, the drive is in the appropriate slot in a fixed position and is disengaged from the base plane printed circuit board (PCB). To reengage the drive with the base plane printed circuit board (PCB), the drive carrier is again removed from the slot, rotated 180 degrees, and reinserted into the slot.

In another aspect, at least one slot rail of a slot includes a (e.g., sheet metal) spring. The spring allows a drive carrier to rest on the spring in a position where the hard drive is in a fixed position and disengaged from the base plane printed circuit board. The spring is configured to prevent movement of the drive carrier towards the base plane printed circuit board (PCB) when force (e.g., due to gravity) less than a specified force is applied against the spring. For example, the spring can be configured to support the combined weight of the hard drive and drive carrier to hold the drive carrier above the base plane printed circuit board (PCB). The spring is also configured to permit movement of the drive carrier towards the base plane printed circuit board (PCB) when force equal to or greater than the specified force is applied against the spring. For example, the spring can be configured to compress between the slot rail and the drive carrier rail when sufficient additional force (in addition to the combined weight of the hard drive and drive carrier) is applied, such as, by a technician pushing down on the drive carrier.

To engage the drive with the base plane printed circuit board (PCB), the drive carrier is inserted into the slot rail. To permit access to the base plane printed circuit board (PCB), the drive carrier is partially removed from the slot to a position where the spring expands into the slot. The drive carrier then rests on the spring. As such, the drive is in the appropriate slot and is disengaged from the base plane printed circuit board (PCB). To reengage the drive with the base plane printed circuit board (PCB), sufficient additional force is applied to overcome the spring's mechanical resistance and fully insert the drive carrier into the slot.

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by practice. The features and advantages may be realized and obtained by means of the instruments and combinations particularly pointed out in the appended claims. These and other features and advantages will become more fully apparent from the following description and appended claims, or may be learned by practice as set forth hereinafter.

BRIEF DESCRIPTION OF THE DRAWINGS

In order to describe the manner in which the above-recited and other advantages and features can be obtained, a more particular description will be rendered by reference to specific implementations thereof which are illustrated in the appended drawings. Understanding that these drawings depict only some implementations and are not therefore to be considered to be limiting of its scope, implementations will be described and explained with additional specificity and detail through the use of the accompanying drawings in which:

FIG. 1 illustrates an example equipment rack.

FIG. 4A illustrates the example drive carrier being inserted into a slot in a rack.

FIG. 4B illustrates the example drive carrier inserted sufficiently into the slot to engage the hard drive with a base plane Printed Circuit Board (PCB).

FIG. 5D illustrates the example drive carrier inserted sufficiently into the slot to engage the hard drive with a base plane Printed Circuit Board (PCB).

DETAILED DESCRIPTION

Figure 2A:
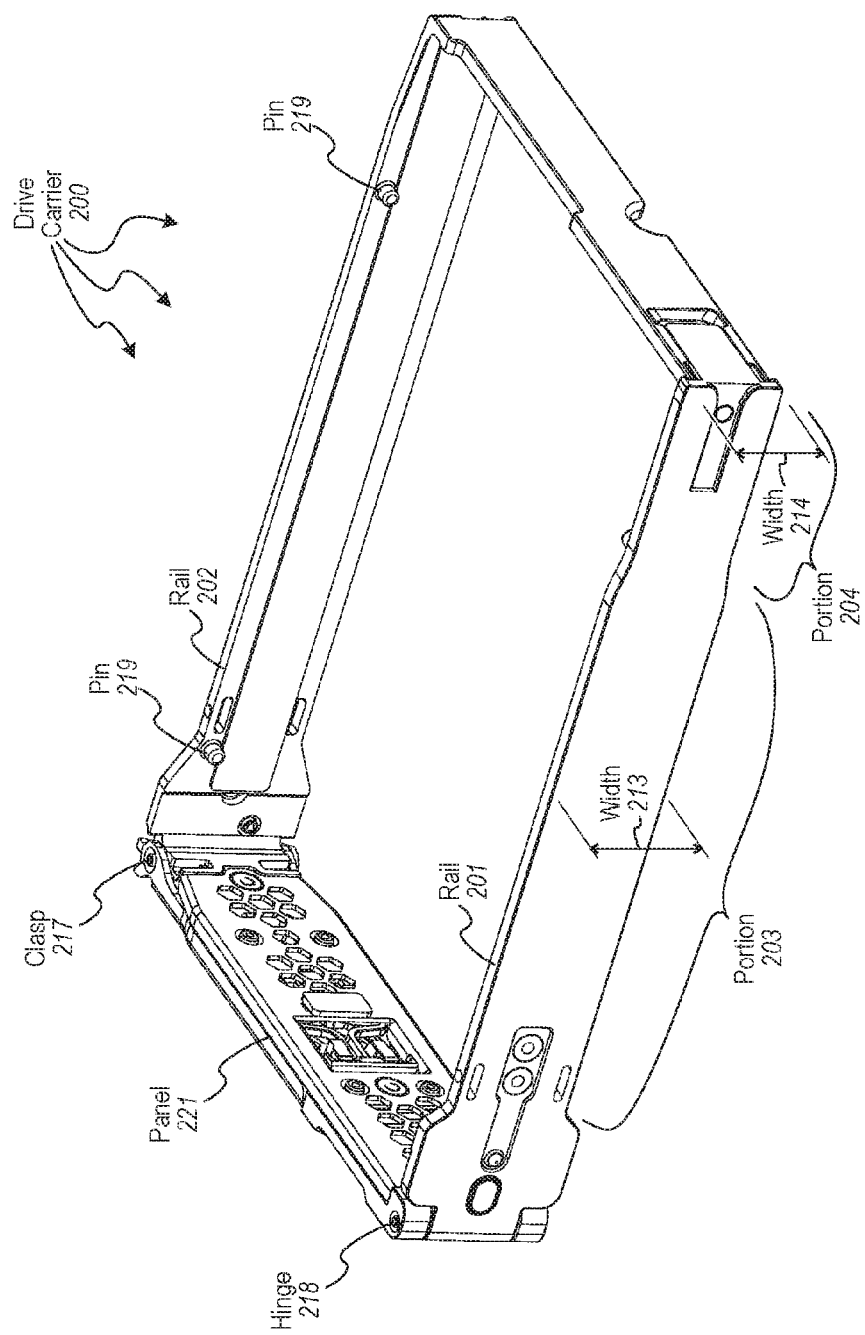
FIGS. 2A and 2B illustrate an example drive carrier.

Examples extend to devices facilitating positioning components in a rack to permit base plane access. In general, a drive carrier containing a hard drive can be inserted into a slot in a rack to engage the hard drive (mechanically and electrically) with a base plane printed circuit board (PCB). Components of a drive carrier rail and/or a slot rail can be configured to hold the drive carrier in a position within a slot where the drive is disengaged from the base plane printed circuit board (PCB). Disengagement of the hard drive from the base plane printed circuit board (PCB) allows the base plane printed circuit board (PCB) to be accessed for servicing, replacement, etc. while the drive carrier remains in the slot.

In one aspect, a drive carrier rail is configured to facilitate positioning a drive carrier in a fixed position within a slot (of a rack) where the drive is disengaged from the base plane printed circuit board (PCB). Slot rails in the slot can be different widths, one narrower and the other wider. The drive carrier can include a narrower driver carrier rail and a variable width driver carrier rail. The narrower drive carrier rail can be at least slightly narrower than the narrower slot rail. The variable width drive carrier rail can include a narrower portion and a wider portion. The narrower portion is at least slightly narrower than the narrower slot rail. The wider portion is at least slightly narrower than the wider slot rail and at least slightly wider than the narrower slot rail.

To engage the drive with the base plane printed circuit board (PCB), the drive carrier is oriented so that the narrower drive carrier rail is inserted into the narrower slot rail and the variable width drive carrier rail is inserted into the wider slot rail. To permit access to the base plane printed circuit board (PCB), the drive carrier is removed from the slot, rotated 180 degrees, and reinserted into the slot. Upon reinsertion, the narrower drive carrier rail is inserted into the wider slot rail and the variable width drive carrier rail is inserted into the narrower slot rail. The drive carrier can be inserted into the slot until the wider portion of the variable width drive carrier rail prevents further movement of the drive carrier due to the width of the wider portion being greater than the width of narrower slot rail. As such, the drive is in the appropriate slot in a fixed position and is disengaged from the base plane printed circuit board (PCB). To reengage the drive with the base plane printed circuit board (PCB), the drive carrier is again removed from the slot, rotated 180 degrees, and reinserted into the slot.

In another aspect, at least one slot rail of a slot includes a (e.g., sheet metal) spring. The spring allows a drive carrier to rest on the spring in a position where the hard drive is in a fixed position and disengaged from the base plane printed circuit board. The spring is configured to prevent movement of the drive carrier towards the base plane printed circuit board (PCB) when force (e.g., due to gravity) less than a specified force is applied against the spring. For example, the spring can be configured to support the combined weight of the hard drive and drive carrier to hold the drive carrier above the base plane printed circuit board (PCB). The spring is also configured to permit movement of the drive carrier towards the base plane printed circuit board (PCB) when force equal to or greater than the specified force is applied against the spring. For example, the spring can be configured to compress between the slot rail and the drive carrier rail when sufficient additional force (in addition to the combined weight of the hard drive and drive carrier) is applied, such as, by a technician pushing down on the drive carrier.

To engage the drive with the base plane printed circuit board (PCB), the drive carrier is inserted into the slot rail. To permit access to the base plane printed circuit board (PCB), the drive carrier is partially removed from the slot to a position where the spring expands into the slot. The drive carrier then rests on the spring. As such, the drive is in the appropriate slot and is disengaged from the base plane printed circuit board (PCB). To reengage the drive with the base plane printed circuit board (PCB), sufficient additional force is applied to overcome the spring's mechanical resistance and fully insert the drive carrier into the slot.

In other aspects, a different type of spring or some other mechanically resistive component, such as, for example, a plastic or rubber protrusion or extrusion, is used to position a drive carrier so that a drive is in the appropriate slot and disengaged from the base plane printed circuit board (PCB).

FIG. 1 illustrates an example equipment rack 100. Drawer 111 can be pulled from under lid 106 using slide 107. Drawer 111 includes a power supply unit 102, a number of drive carriers 113 containing hard drives 103, and a number of fans 104. Each of hard drives 103 can engage with a connector 109 of base plane printed circuit board (PCB) 101 (e.g., using blind mating). As depicted, a base plane PCB 101 can include a number of connectors 109. Each of connectors 109 can be configured to engage with a corresponding connector on a hard drive. Each base plane PCB 101 can be configured to engage with a specified number of (e.g., 8) hard drives.

Drive dividers 108 are used to separate different rows of hard drives. The drive dividers can include slot rails used to form slots for receiving drive carriers 113 containing hard drives 103.

Figure 2B:
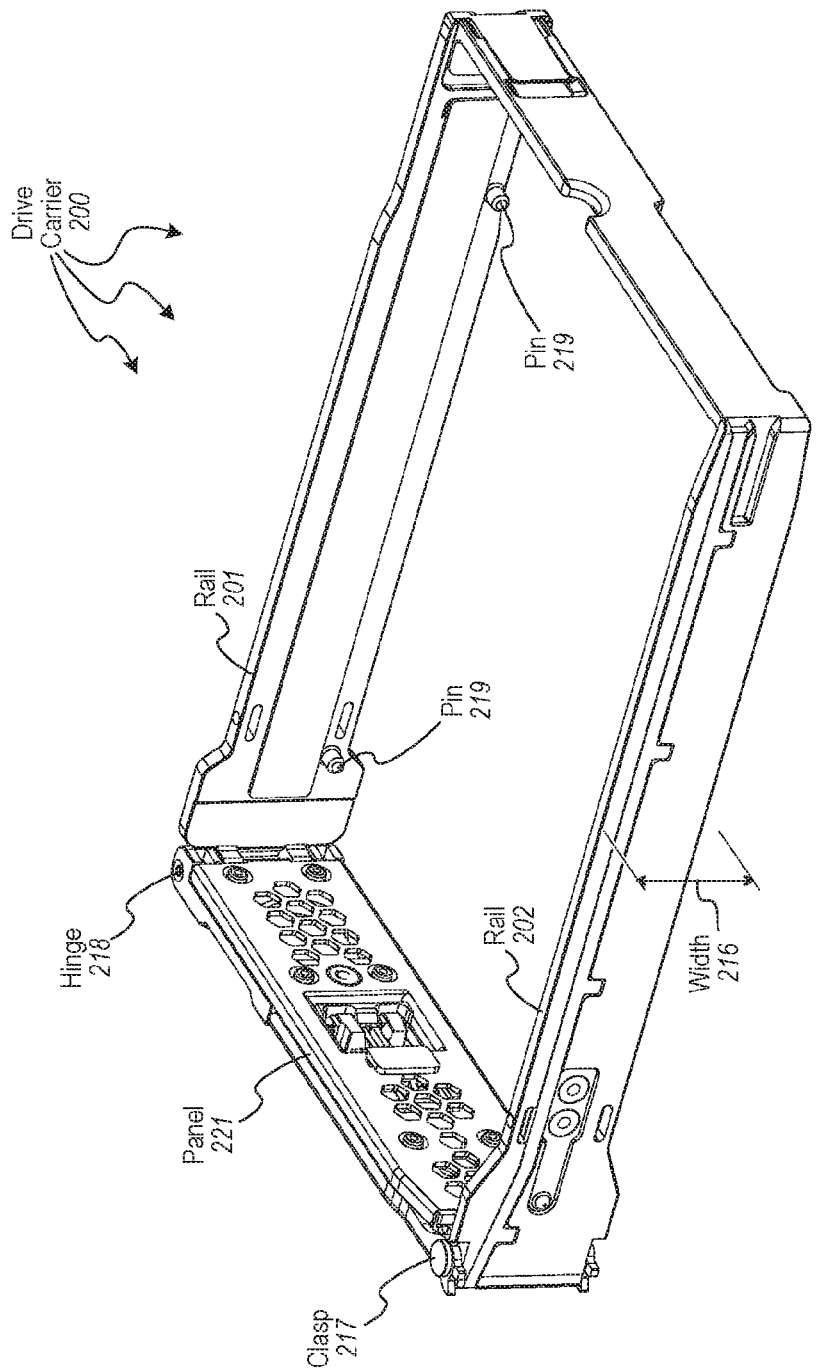

In some aspects, drive carrier rails are configured so that a drive carrier can (at least in one configuration) rest in a fixed position within a slot to permit base plane PCB access. FIGS. 2A and 2B illustrate an example drive carrier 200. As depicted, drive carrier 200 includes rails 201 and 202. Rail 201 (a variable width rail) includes portions 203 and 204. Portion 203 has width 213 and portion 204 has width 214. Rail 202 has width 216. Width 213 can be greater than width 214 and greater than width 216. Rails 201 and 202 can be constructed from plastic and/or metal.

Clasp 217 can be disconnected and panel 221 can be rotated around hinge 218. A hard drive can be placed in the interior of drive carrier 200. Pins 219 can be matched to corresponding holes on the exterior surface of the hard drive. Panel 221 can be rotated around hinge 218 and clasp 217 reconnected to secure the hard drive inside drive carrier 200.

Figure 3A:
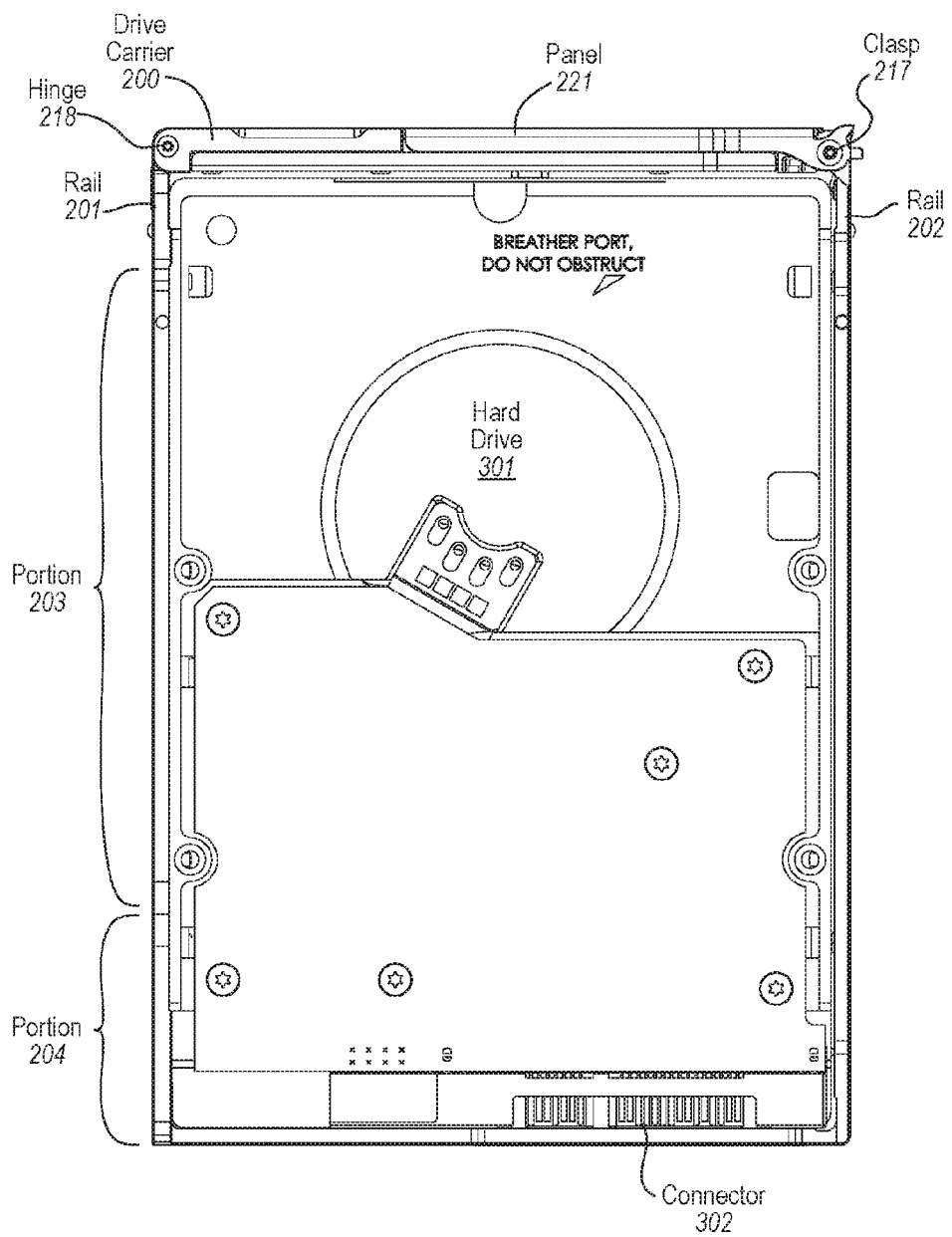
FIGS. 3A and 3B illustrate a hard drive contained in the example drive carrier.
Figure 3B:
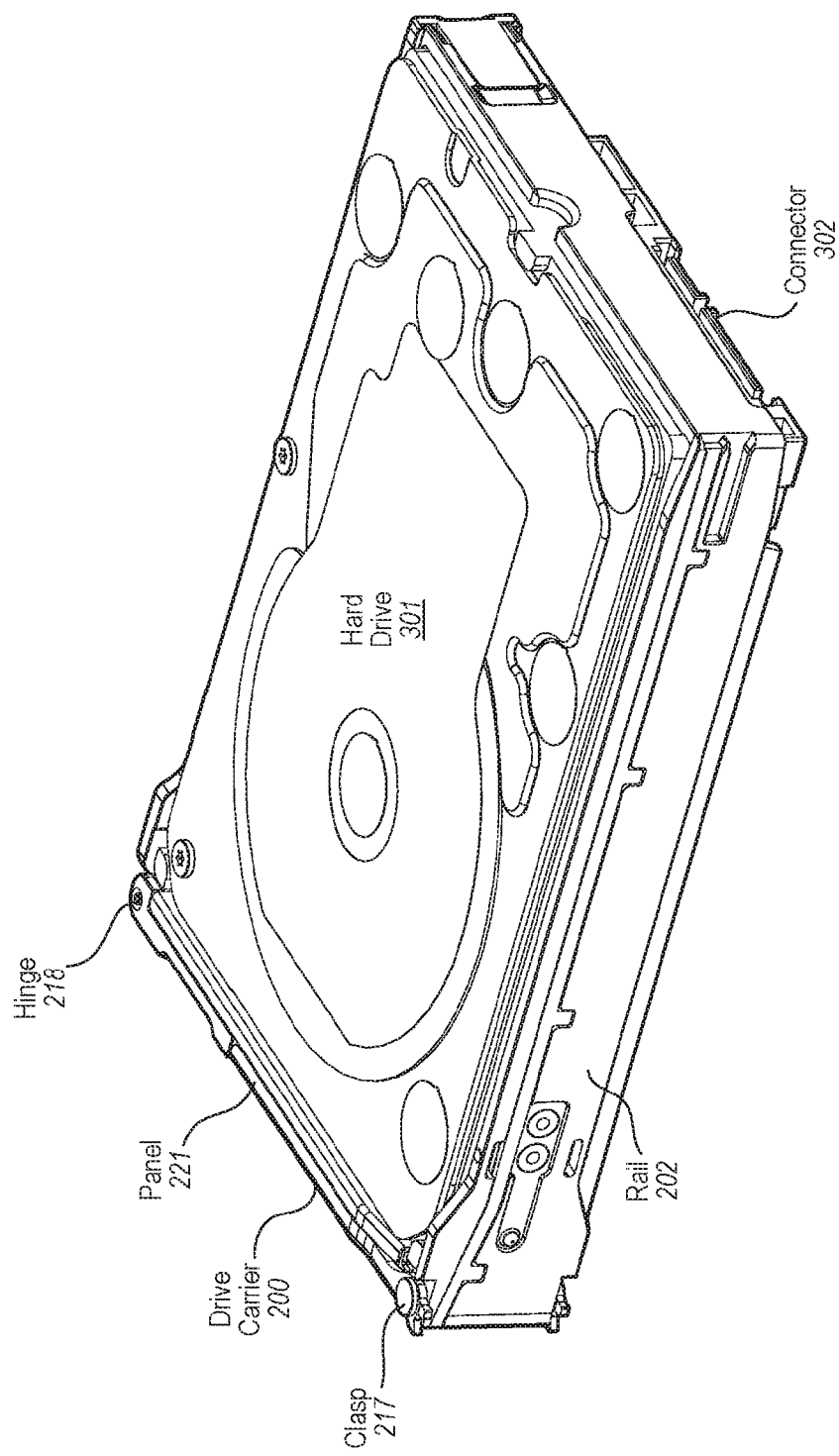

FIGS. 3A and 3B illustrate a hard drive 301 contained in drive carrier 200. Hard drive 301 includes connector 302. Connector 302 can engage with a corresponding connector on a base plane PCB (e.g., a connector 109) to connect hard drive 301 (both mechanically and electrically) to the base plane PCB FIG. 4A illustrates drive carrier 200 being inserted into a slot in rack 400. Rack 400 includes drive divider 408. Rails 401 and 402 collectively represent the slot within rack 400. Rail 401 has width 411 and rail 402 has width 412. Width 411 can be wider than width 412. Base plane PCB 421 includes a number of connectors 409.

Drive carrier 200 is oriented so that rail 201 is inserted into rail 401 and rail 202 is inserted into rail 402. Width 213 can be at least slightly less than width 411 and width 216 can be at least slightly less than width 412. As such, in the configuration in FIG. 4A, each slot rail receives a drive carrier rail that is at least slightly narrower than the slot rail. Accordingly, turning to FIG. 4B, drive carrier 200 can be inserted into the slot sufficiently to engage connector 302 (both mechanically and electrically) with a connector 409.

Figure 4C:
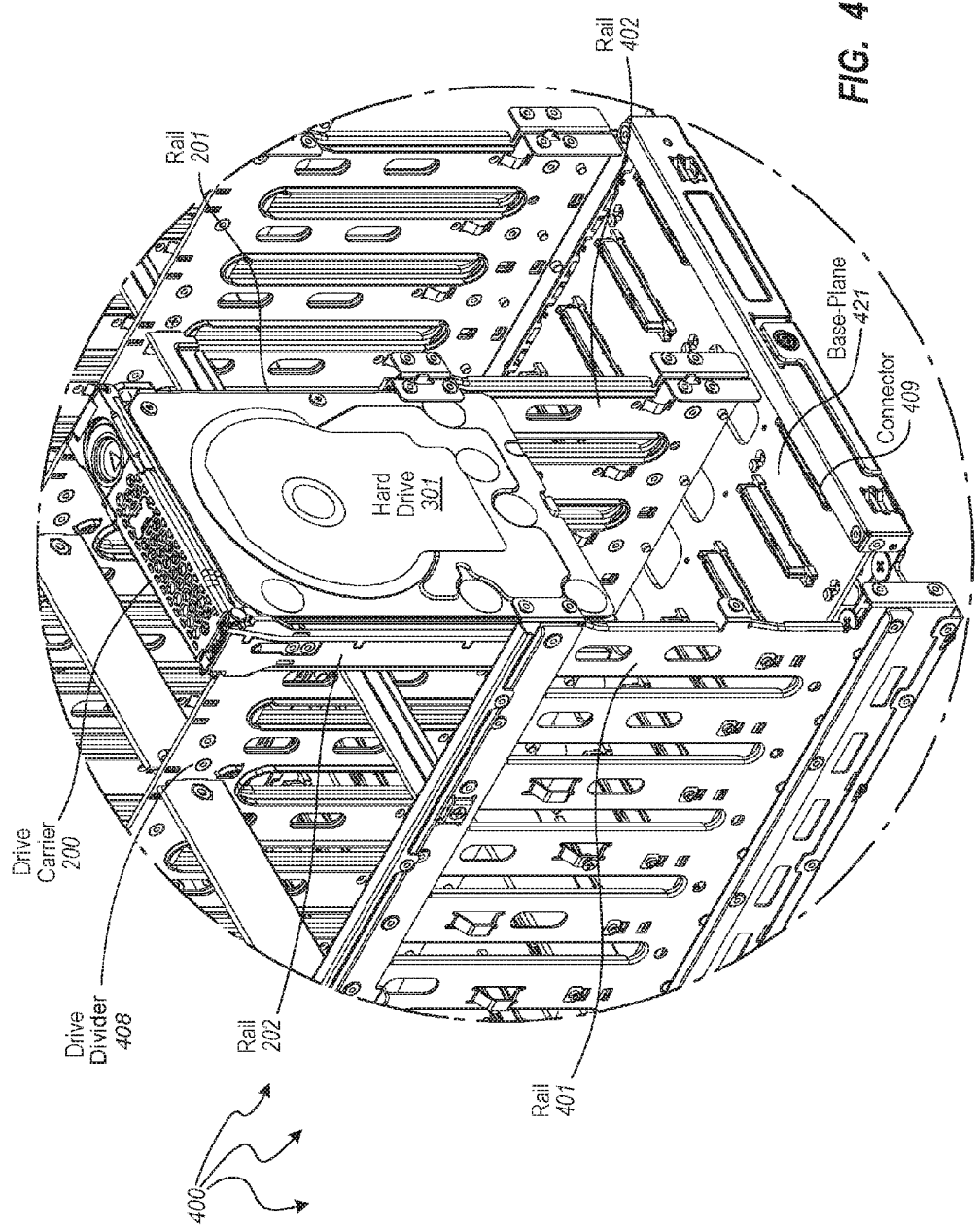
FIG. 4C illustrates the example drive carrier positioned in the slot in position that permits access to the base plane Printed Circuit Board (PCB).

Subsequently, it may be appropriate to service, replace, etc. base plane PCB 421. Drive carrier 200 can be fully removed from slot 419, reoriented by rotating 180 degrees, and inserted back into slot 419. Turning to FIG. 4C, drive carrier 200 is positioned in slot 419 in a position that permits access to the base plane PCB 401. Drive carrier 200 is oriented so that rail 201 is inserted into rail 402 and rail 202 is inserted into rail 401. Width 214 can be at least slightly less than width 411 and width 213 can be at least slightly greater than width 411.

As such, drive carrier 200 can be inserted into the slot until portion 203 of rail 201 reaches entry into 402. When portion 203 is reached, insertion of drive carrier 200 is stopped due to portion 203 being wider than rail 402. That is, width 213 is greater than width 411. As such, drive 301 is in the slot in a fixed position and is disengaged from base plane PCB 421. Base plane PCB 421 can then be removed for service, replacement, etc.

To reengage connector 302 with a connector 409 of base plane PCB 421 (or of a replacement base plane PCB), drive carrier 200 can again be removed from the slot, again rotated 180 degrees, and reinserted as depicted in FIGS. 4A and 4B.

Figure 5A:
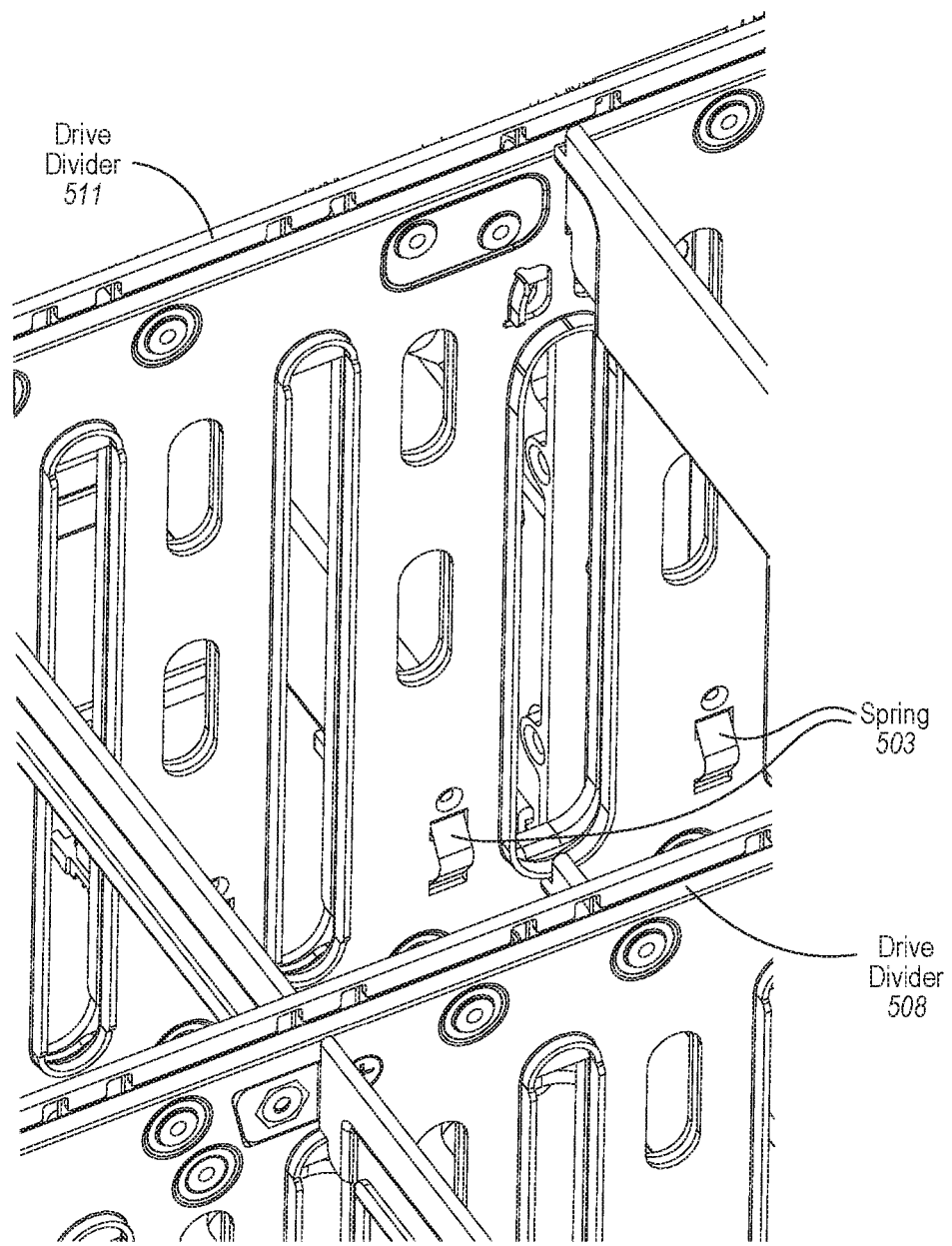
FIG. 5A illustrates an example slot rail on a drive divider.

In other aspects, slot rails are configured so that a drive carrier can be positioned in a slot to permit base plane PCB access. FIG. 5A illustrates an example of slot rails on drive dividers 511 and 508. As depicted, slot rails can include (e.g., sheet metal) springs 503. A spring 503 can be configured to support the collective weight of drive carrier 200 and hard drive 301. Spring 503 can also be configured to permit drive carrier 200 to continue to be inserted when sufficient additional force is applied (e.g., a technician pushing drive carrier 200).

Figure 5B:
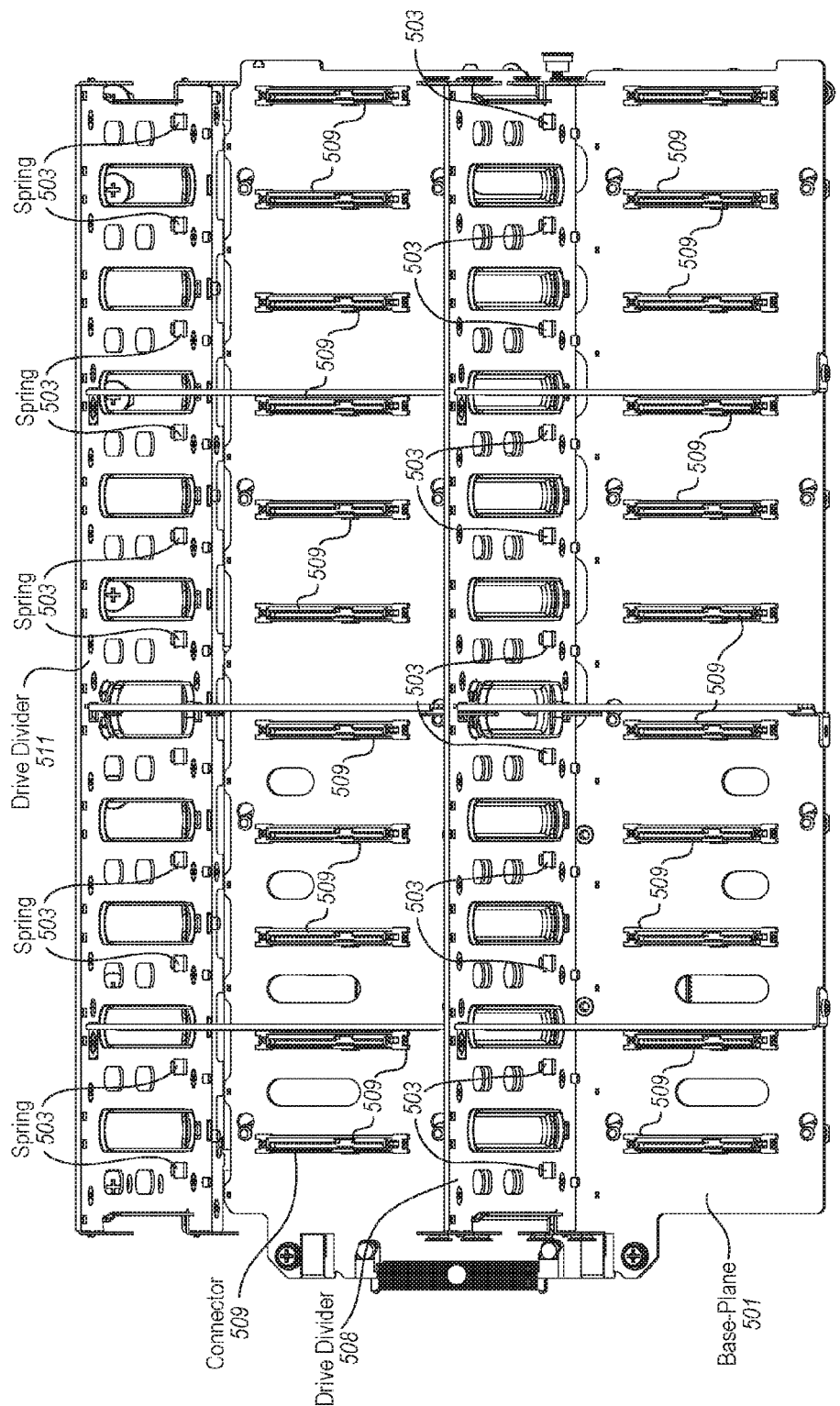
FIG. 5B illustrates a number of drive dividers and corresponding slot rails with springs.

FIG. 5B illustrates drive dividers 508 and 511 with springs 503. Base plane PCB 501 is also depicted. Base plane 501 includes connectors 509 for engaging with corresponding connectors on hard drives.

Figure 5C:
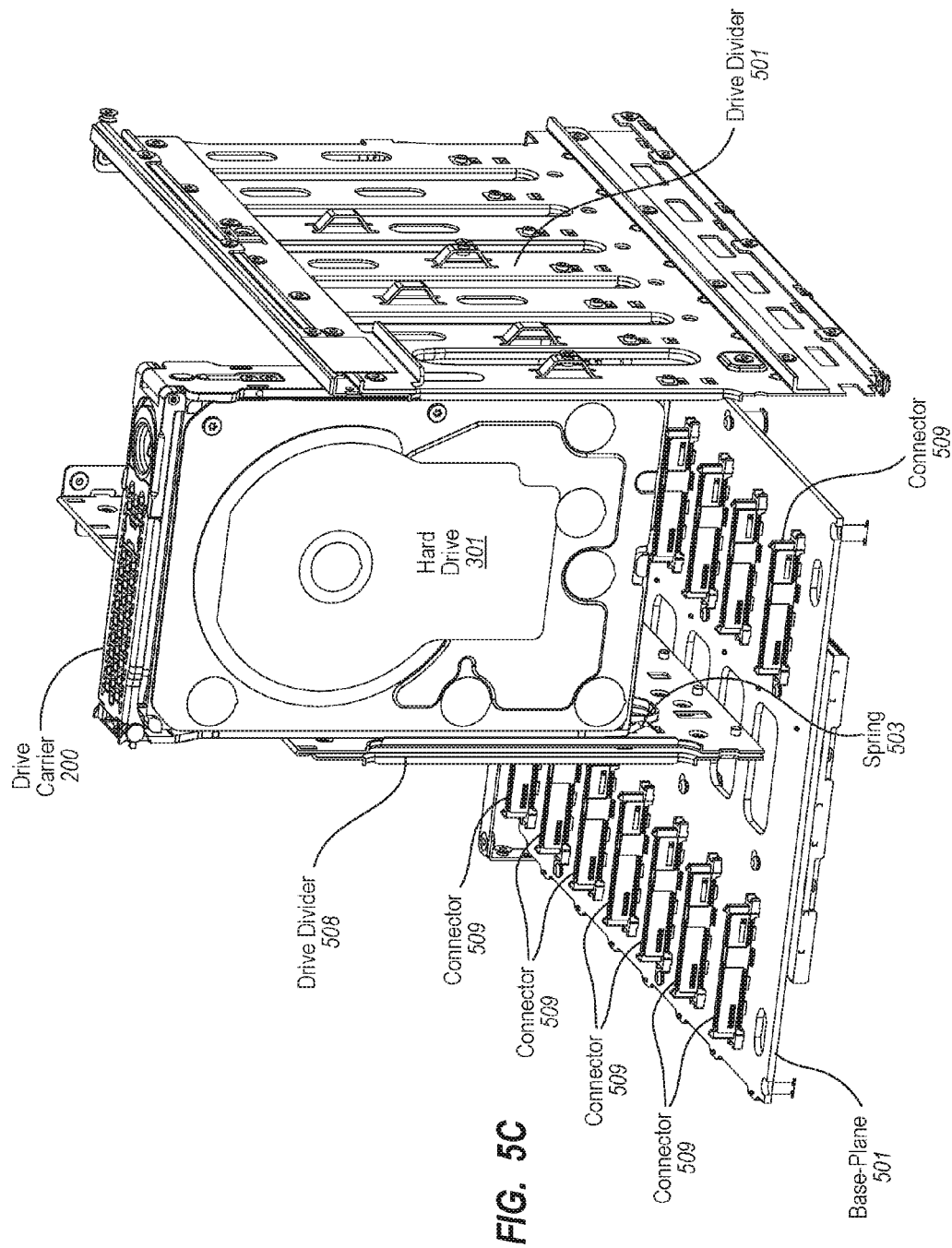
FIG. 5C illustrates the example drive carrier positioned in the slot in position that permits access to the base plane Printed Circuit Board (PCB).

FIG. 5C illustrates drive carrier 200 being inserted into a slot in rack 500. Rack 500 includes drive dividers 508 and 501. Drive carrier rails on drive carrier 200 can be configured as slightly narrower that slot rails in slots of rack 500. As such, drive carrier 200 is not impeded on entry due to the width of drive carrier rails. That is, in the configuration in FIG. 5C, each slot rail receives a drive carrier rail that is at least slightly narrower than the slot rail.

Drive carrier 200 is positioned in the slot in a fixed position that permits access to the base plane PCB 501. Drive carrier 200 can be inserted into the slot until spring 503 is reached. When spring 503 is reached, insertion of drive carrier 200 can be stopped due to mechanical resistance from spring 503 and drive carrier 200 can rest on spring 503. As such, drive 301 is in the slot and is disengaged from base plane PCB 501. Base plane PCB 501 can be removed for service, replacement, etc.

Alternately, it may be that drive carrier 200 was inserted into the slot sufficiently to engage connector 302 (both mechanically and electrically) with a connector 509. As such, spring 503 can be compressed between a drive carrier rail and a slot rail. Drive carrier 200 can be removed from the slot until spring 503 is passed. Upon drive carrier 200 passing spring 503, spring 503 can expand into the slot. Removal of drive carrier 200 can stop and drive carrier 200 can rest on spring 503. As such, drive 301 is in the slot and is disengaged from base plane PCB 501. Base plane PCB 501 can be removed for service, replacement, etc.

To reengage connector 302 with a connector 509 of base plane PCB 501 (or of a replacement base plane PCB), sufficient additional force can be applied to drive carrier 200 to overcome the mechanical resistance of spring 503. When sufficient additional force is applied, spring 503 can be compressed between the drive carrier rail and the slot rail and drive carrier 200 can continue insertion until connector 302 engages with a connector 509. FIG. 5D illustrates drive carrier 200 inserted sufficiently into the slot to engage connector 302 with a connector 509. The cut away portion of FIG. 5D depicts spring 503 compressed.

In other aspects, a different type of spring or some other mechanically resistive component, such as, for example, a plastic or rubber extrusion or protrusion, is used in place of spring 503 to position a drive carrier so that a drive is in a fixed position in the appropriate slot and disengaged from the base plane printed circuit board (PCB).

The present described aspects may be implemented in other specific forms without departing from its spirit or essential characteristics. The described aspects are to be considered in all respects only as illustrative and not restrictive. The scope is, therefore, indicated by the appended claims rather than by the foregoing description. All changes which come within the meaning and range of equivalency of the claims are to be embraced within their scope.

What is claimed:

1. A hard drive carrier for insertion into a slot in a drive rack, the slot for receiving hard drive carriers and facilitating connections from hard drives to a base plane printed circuit board, the slot having a first slot rail of a first width and a second slot rail of a second width, the second width larger than the first width, the hard drive carrier comprising: a plurality of connection points for containing a hard drive inside the hard drive carrier; a variable width drive carrier rail, that variable width drive carrier rail having a narrower portion and a wider portion, the narrower portion having a third width and the wider portion having a fourth width, the third width smaller than the first width, the fourth width smaller than the second width and larger than the first width, the variable width drive rail carrier fully insertable into the second slot rail to engage the hard drive with the base plane printed circuit board, the variable width drive carrier rail partially insertable into the first rail slot by inserting the narrower portion into the first rail slot until the wider portion of the variable width drive carrier rail prevents further insertion.

2. The hard drive carrier of claim 1, further comprising:
a second drive carrier rail, the second drive carrier rail having a fifth width, the fifth width being smaller than the first width, the second drive carrier rail fully insertable into the first slot rail to engage the hard drive with the base plane printed circuit board.

3. The hard drive carrier of claim 1, wherein a plurality of connection points for containing a hard drive inside the hard drive carrier comprises a plurality of pins matched for insertion into corresponding holds on the hard drive.

4. The hard drive carrier of claim 1, further comprising a panel and a hinge, the panel rotating about the hinge to open the drive carrier to receive a hard driver and to close the drive carrier when a hard driver is received.

5. The hard drive carrier of claim 4, further comprising a clasp that holds the drive carrier closed when secured.

6. The hard drive carrier of claim 1, wherein the hard drive carrier is inserted into a slot in a drive rack that includes a power supply and a fan.

7. The hard driver carrier of claim 1, wherein a variable width drive carrier rail is constructed from one or more of: plastic or metal.

* * * * *